(12) United States Patent
Cho (10) Patent No.: US 9,496,168 B2
(45) Date of Patent: Nov. 15, 2016

(54) SEMICONDUCTOR PACKAGE WITH VIA-COUPLED POWER TRANSISTORS

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/605,675

(22) Filed: Jan. 26, 2015

(65) Prior Publication Data

US 2015/0270249 A1    Sep. 24, 2015

Related U.S. Application Data

(60) Provisional application No. 61/954,943, filed on Mar. 18, 2014.

(51) Int. Cl.
*H03B 21/00*       (2006.01)
*H03B 1/00*        (2006.01)
(Continued)

(52) U.S. Cl.
CPC ....... *H01L 21/76802* (2013.01); *H01L 21/486* (2013.01); *H01L 23/492* (2013.01); *H01L 23/49517* (2013.01); *H01L 23/49562* (2013.01); *H01L 23/49575* (2013.01); *H01L 24/97* (2013.01); *H01L 25/072* (2013.01); *H01L 29/7827* (2013.01); *H01L 23/3121* (2013.01); *H01L 24/11* (2013.01); *H01L 24/13* (2013.01); *H01L 24/14* (2013.01); *H01L 24/16* (2013.01); *H01L 24/29* (2013.01); *H01L 24/32* (2013.01); *H01L 24/73* (2013.01); *H01L 24/83* (2013.01); *H01L 2224/0401* (2013.01); *H01L 2224/04026* (2013.01); *H01L 2224/06181* (2013.01); *H01L 2224/1132* (2013.01); *H01L 2224/131* (2013.01); *H01L 2224/1403* (2013.01); *H01L 2224/16225* (2013.01); *H01L 2224/291* (2013.01); *H01L 2224/2919* (2013.01); *H01L 2224/32245* (2013.01); *H01L 2224/73253* (2013.01); *H01L 2224/8382* (2013.01); *H01L 2224/8384* (2013.01); *H01L 2224/83455* (2013.01); *H01L 2224/83801* (2013.01); *H01L 2224/83851* (2013.01); *H01L 2224/97* (2013.01); *H01L 2924/1027* (2013.01);
(Continued)

(58) Field of Classification Search
USPC .................. 327/108–112, 379, 389, 391; 326/22–27, 81–87
See application file for complete search history.

(56) References Cited

U.S. PATENT DOCUMENTS

2011/0049717 A1* 3/2011 West ................. H01L 23/26
                                                257/751
2012/0043598 A1* 2/2012 de Rochemont ....... H01L 23/64
                                                257/300

(Continued)

*Primary Examiner* — Brandon S Cole
(74) *Attorney, Agent, or Firm* — Shumaker & Sieffert, P.A.

(57) ABSTRACT

In one implementation, a semiconductor package includes a carrier including first and second conductive segments, and first and second transistors attached respectively to the first and second conductive segments. The semiconductor package also includes a dielectric material formed in exposed portions of the first and second conductive segments, a first via extending through the dielectric material to the first conductive segment, and a second via extending through the dielectric material to the second conductive segment. A solder material fills each of the vias, the solder material protruding beyond the dielectric material and configured to electrically, thermally, and mechanically connect the carrier to a mounting surface for the semiconductor package.

20 Claims, 7 Drawing Sheets

(51) Int. Cl.
*H01L 21/768* (2006.01)
*H01L 25/07* (2006.01)
*H01L 23/495* (2006.01)
*H01L 29/78* (2006.01)
*H01L 21/48* (2006.01)
*H01L 23/492* (2006.01)
*H01L 23/00* (2006.01)
*H01L 23/31* (2006.01)

(52) U.S. Cl.
CPC .............. *H01L 2924/1032* (2013.01); *H01L 2924/1033* (2013.01); *H01L 2924/10253* (2013.01); *H01L 2924/12042* (2013.01); *H01L 2924/1306* (2013.01); *H01L 2924/13064* (2013.01); *H01L 2924/13091* (2013.01); *H01L 2924/14* (2013.01)

(56) References Cited

U.S. PATENT DOCUMENTS

| 2012/0292746 | A1* | 11/2012 | Lee | H01L 21/76898 257/621 |
| 2013/0113103 | A1* | 5/2013 | West | H01L 23/481 257/751 |
| 2014/0151895 | A1* | 6/2014 | West | H01L 21/76898 257/774 |
| 2015/0270249 | A1* | 9/2015 | Cho | H01L 25/072 327/109 |

* cited by examiner

SEMICONDUCTOR PACKAGE WITH VIA-COUPLED POWER TRANSISTORS

The present application claims the benefit of and priority to a provisional application entitled "Power Converter Package with Laser Via Coupled Switches," Ser. No. 61/954,943, filed on Mar. 18, 2014. The disclosure in this provisional application is hereby incorporated fully by reference into the present application.

BACKGROUND

Background Art

Semiconductor packages designed to house multiple chips or dies, also referred to as multi-chip modules (MCMs), are used in a wide variety of applications. For example, an MCM may be used to implement a voltage converter power block including control and sync transistors, as well as the high current switch node connection between the control and sync transistors. In conventional voltage converter packaging solutions, the switch node connection between the control and sync transistors is typically implemented using a conductive clip, such as a copper clip, which must be sufficiently robust to accommodate high current. Because the control and sync transistors can be highly sensitive to electrical resistance, the cross-sectional area of the conductive clip used to provide the switch node connection may have to be relatively large.

Moreover, the control and sync transistors are capable of generating substantial heat during operation. In many conventional implementations, that potentially damaging heat necessitates use of a dedicated heat spreader, which is also often relatively large. Consequently, conventional voltage converter packages must typically be sized to accommodate not only the control and sync transistors, but a large heat spreader providing thermal protection for those power transistors, and a large conductive clip for their connection, as well.

SUMMARY

The present disclosure is directed to a semiconductor package with via-coupled power transistors, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Voltage converters are used in a variety of electronic circuits and systems. For instance, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

Figure 1:
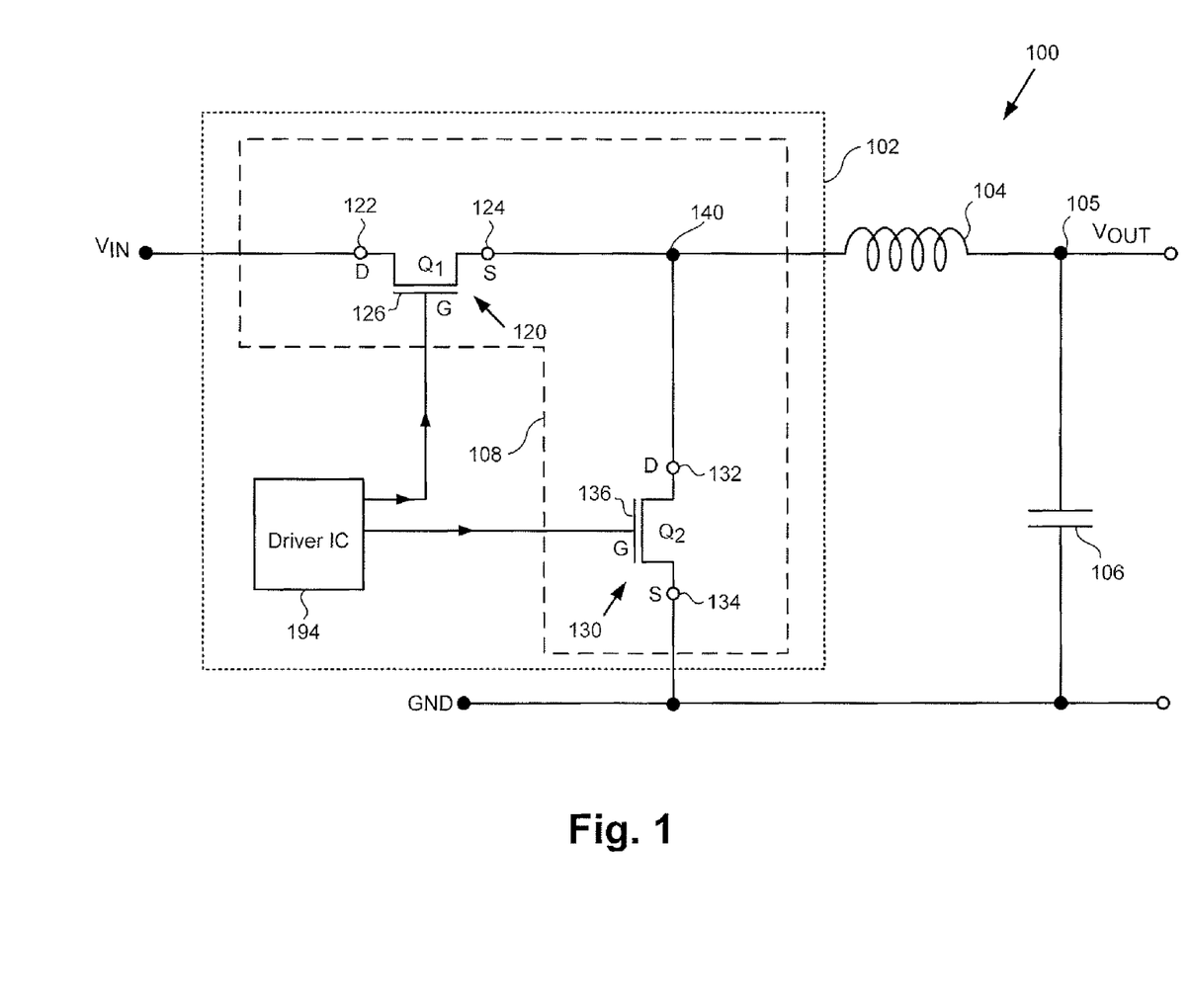
FIG. 1 shows a diagram of an exemplary circuit suitable for use as a voltage converter.

FIG. 1 shows a diagram of exemplary voltage converter 100 including power stage multi-chip module (MCM) 102, output inductor 104, and output capacitor 106. As shown in FIG. 1, power stage MCM 102 includes power block 108, which may also be implemented as an MCM, and driver IC 194 implemented to provide drive signals to power block 108. As shown in FIG. 1, voltage converter 100 is configured to receive an input voltage $V_{IN}$, and to provide a converted voltage, e.g., a rectified and/or stepped down voltage, as $V_{OUT}$ at output 105.

Exemplary power block 108 is implemented using two power switches in the form of metal-oxide-semiconductor field-effect transistors (MOSFETs) configured as a half-bridge. That is to say, power block 108 includes high side, or control, transistor 120 ($Q_1$) having drain 122, source 124, and gate 126, as well as low side, or sync, transistor 130 ($Q_2$) having drain 132, source 134, and gate 136. Control transistor 120 is coupled in series with sync transistor 130 at switch node 140, which, in turn, is coupled to output 105 through output inductor 104. Respective control and sync transistors 120 and 130 may be implemented as group IV based power devices, such as silicon power MOSFETs having a vertical design, for example. Voltage converter 100 may be advantageously utilized as a voltage converter, for example a buck converter, in a variety of automotive, industrial, appliance, and lighting applications.

It is noted that in the interests of ease and conciseness of description, the present inventive principles will in some instances be described by reference to specific implementations of a buck converter including one or more silicon based power transistors. However, it is emphasized that such implementations are merely exemplary, and the inventive principles disclosed herein are broadly applicable to a wide range of applications, including buck and boost converters, implemented using other group IV material based, or group III-V semiconductor based, power transistors. For example, control and sync transistors 120 and 130 may be implemented as any type of silicon or other group IV FET, such as but not limited to MOSFETs and metal-insulator-semiconductor FETs (MISFETs), for instance. Moreover, control and sync transistors 120 and 130 may be implemented as any type of gallium nitride (GaN) or other group III-V transistor, such as but not limited to heterostructure FETs (HFETs) or high electron mobility transistors (HEMTs), for example.

It is noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using GaN, in which the group III element or elements include some or a substantial amount of gallium, but may also include other group III elements in addition to gallium.

As noted above, power transistors such as control and sync transistors 120 and 130 are capable of generating substantial heat during operation. That potentially damaging heat can be diverted away from control and sync transistors 120 and 130 using a heat spreader, which in conventional implementations is often relatively large. As a result, packaging solutions for power block 108 and/or power stage MCM 102 must typically be sized to accommodate not only control and sync transistors 120 and 130, but a large heat spreader providing thermal protection for those transistors, as well.

In addition, the connection between control transistor 120 and sync transistor 130 providing switch node 140 is typically implemented using a conductive clip formed from a conductive body merged with and supported at one end by a downward pointing conductive leg. Due to the high current that must be accommodated by the conductive clip, it is generally desirable that the conductive body and its conductive support leg have a relatively large cross-sectional area. Moreover, because control transistor 120 and sync transistor 130 can be highly sensitive to electrical resistance, the cross-sectional area of the conductive clip can have a significant effect on switching performance.

However, as advances in technology enable implementation of ever thinner power transistors as control transistor 120 and sync transistor 130, use of a conventional conductive clip gives rise to conflicting constraints. For example, the permissible thickness of the conductive body portion of a conventional conductive clip is typically limited by the height of its support leg. As control transistor 120 and sync transistor 130 are implemented using ever thinner transistors, the conductive clip support leg must necessarily have a reduced height to properly position the conductive body for contact with the thinner transistors. Consequently, the limitation on the thickness of the conductive body imposed by the reduction in height of the conductive leg results in a reduction of the effective cross-sectional area of the conductive clip, which can undesirably impair performance.

Figure 2:
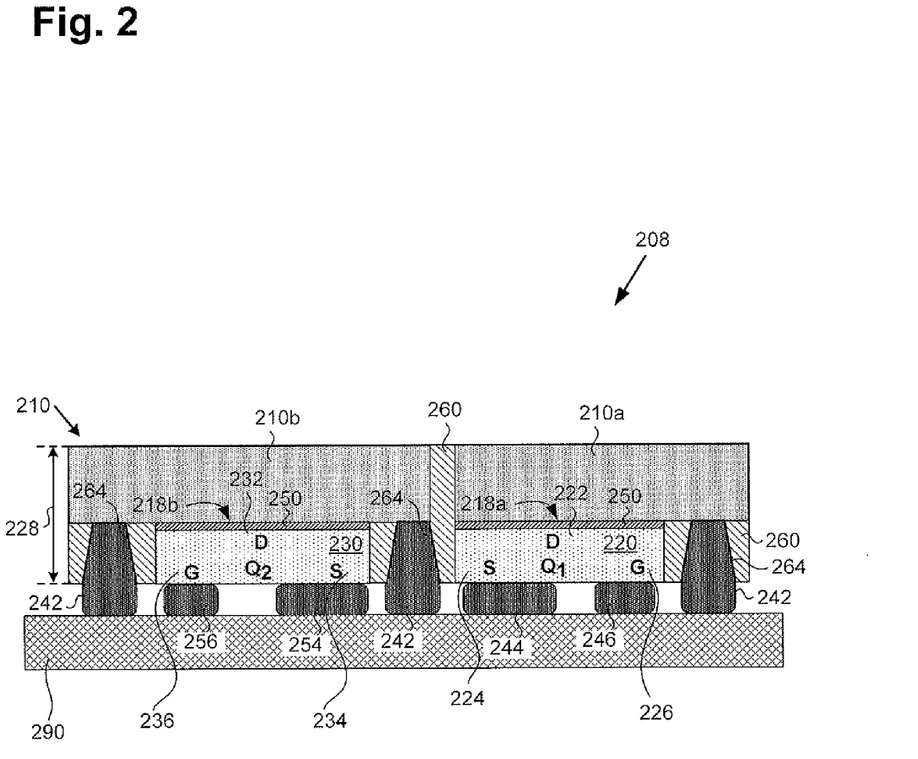
FIG. 2 shows an exemplary representation of a packaging solution according to one implementation of the present disclosure.

The present application discloses a packaging solution enabling omission of the aforementioned discrete heat spreader by integrating its functionality with a carrier utilized as a structural support in the packaging solution, such as a conductive lead frame for example. The disclosed implementations utilize conductive segments of the carrier and solder filled laser vias to provide a reliable, low resistance, and substantially parasitic free electrical connection for establishing switch node 140. The conductive segments of the carrier and the solder filled laser vias also serve to conduct heat out of the semiconductor package, and thus may be implemented to concurrently provide thermal protection for control and sync transistors 120 and 130. FIG. 2 shows an exemplary representation of such a packaging solution.

FIG. 2 shows a cross-sectional view of semiconductor package 208 attached to mounting surface 290, which may be a printed circuit board (PCB) for example, by solder material 242. Semiconductor package 208 has package height or thickness 228, and includes control transistor 220 ($Q_1$) having drain 222, source 224, and gate 226, as well as sync transistor 230 ($Q_2$) having drain 232, source 234, and gate 236. Semiconductor package 208 further includes carrier 210 including conductive segments 210*a* and 210*b* having respective die surfaces 218*a* and 218*b*, electrically and thermally conductive die attach material 250, dielectric material 260, and vias 264. Also included in semiconductor package 208 are source contact 244 and gate contact 246 of control transistor 220, and source contact 254 and gate contact 256 of sync transistor 230.

It is noted that source contacts 244 and 254, and gate contacts 246 and 256 are formed from solder material 242. It is further noted that solder material 242 fills vias 264 so as to protrude beyond dielectric material 260, and as shown in FIG. 2, is configured to electrically, thermally, and mechanically connect carrier 210 to mounting surface 290 for semiconductor package 208.

Semiconductor package 208 corresponds in general to power block 108 in FIG. 1. In addition, control transistor 220 having drain 222, source 224, and gate 226, and sync transistor 230 having drain 232, source 234, and gate 236, correspond in general to control transistor 120 having drain 122, source 124, and gate 126, and sync transistor 130 having drain 132, source 134, and gate 136, respectively, in FIG. 1. Moreover, switch node 140, in FIG. 1, is provided by mounting surface 290, which electrically couples source 224 of control power MOSFET 220 to drain 232 of sync power MOSFET 230 by solder material 242, conductive segment 210*b* of carrier 210, and electrically and thermally conductive die attach material 250.

It is noted in reference to FIG. 2 that the electrical connection between source 224 of control transistor 220 and drain 232 of sync transistor 230 is established in the absence of a conductive clip. Instead, as noted above, according to the implementation shown in FIG. 2, the electrical connection between source 224 and drain 232 establishing switch node 140 in FIG. 1 is advantageously provided by electrically and thermally conductive die attach material 250, carrier 210, solder material 242, and mounting surface 290. As a result, the packaging solution of FIG. 2 provides a robust, low resistance, and low parasitic connection for providing switch node 140.

Carrier 210 and vias 264 filled with solder material 242 also serve to conduct heat out of semiconductor package 208, and thus may be implemented to concurrently provide thermal protection for the transistors. In other words, carrier 210 is configured as an integrated heat spreader of semiconductor package 208. Moreover, use of carrier 510 and vias 264 filled with solder material 242 to provide heat removal and switch node connectivity enables a highly compact semiconductor package design. As a result, package height or thickness 228 may be less than approximately 0.4 mm. For example, in some implementations, package height or thickness 228 may be in a range from approximately 0.25 mm to approximately 0.3 mm.

The features of semiconductor package 208 will be described in greater detail by reference to FIG. 3, and FIGS.

4A, 4B, 4C, 4D, and 4E (hereinafter "FIGS. 4A-4E"). Referring to FIG. 3, FIG. 3 shows flowchart 300 presenting an exemplary method for producing a semiconductor package. It is noted that the method described by flowchart 300 is performed on a portion of a carrier structure, which may be a conductive carrier such as a semiconductor package lead frame, or may take the form of a conductive sheet or plate, for example.

Figure 3:
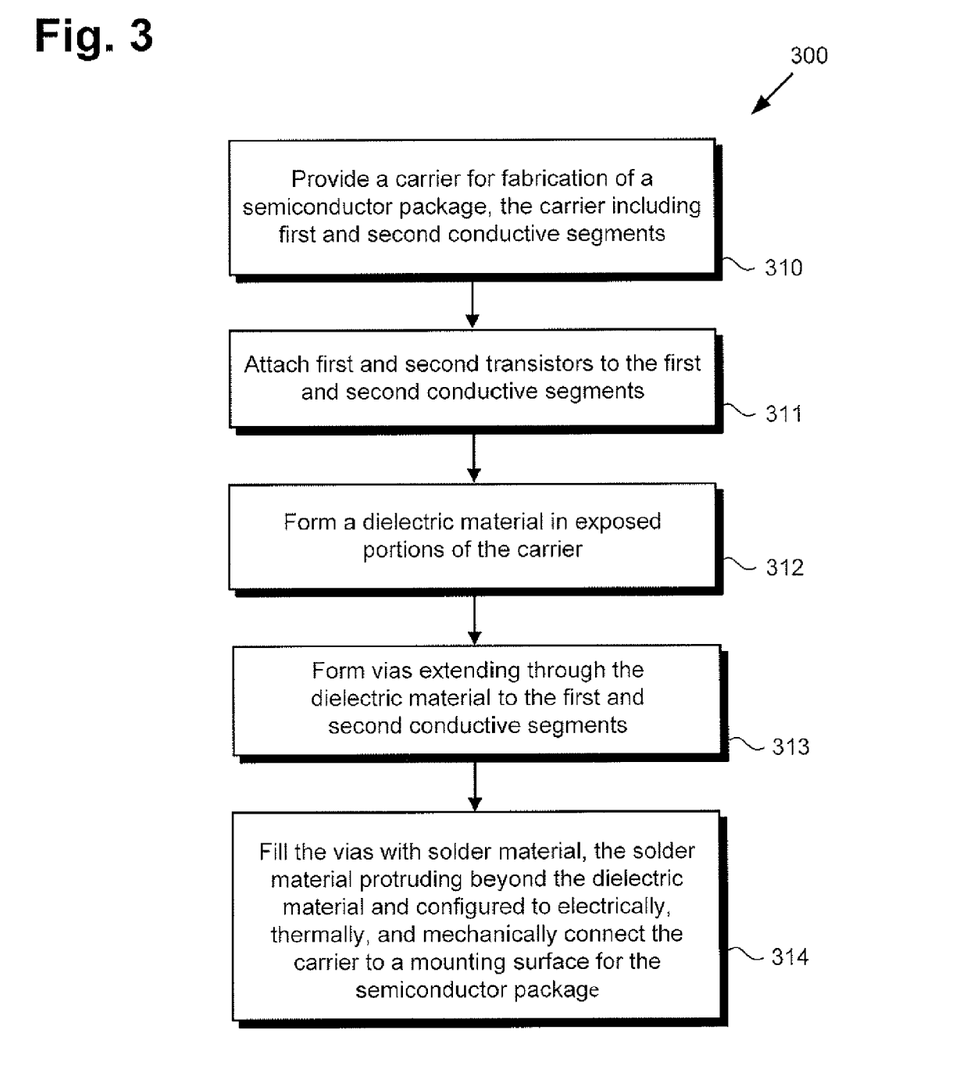
FIG. 3 shows a flowchart presenting an exemplary method for fabricating a semiconductor package according to one implementation of the present disclosure.
Figure 4A:
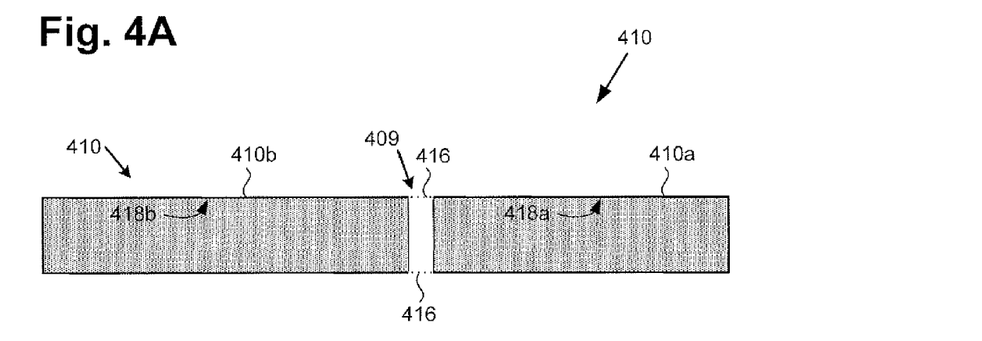
FIG. 4A illustrates a result of performing of an initial action according to the flowchart of FIG. 3 in accordance with one implementation of the present disclosure.

With respect to FIGS. 4A-4E, structures 410 through 414 shown respectively in those figures illustrate the result of performing the method of flowchart 300 on a carrier. For example, FIG. 4A represents a portion of carrier 410 including conductive segments 410a and 410b before processing (action 310), structure 411 shows a portion of carrier 410 after first and second transistors are attached to conductive segments 410a and 410b (action 311), structure 412 shows structure 411 after formation of dielectric material 460 in exposed portions of carrier 410 (action 312), and so forth. It is noted that carrier 410, in FIGS. 4A-4E, corresponds to carrier 210, in FIG. 2.

Referring to flowchart 300, in FIG. 3, in combination with FIG. 4A, flowchart 300 begins with providing carrier 410 for fabrication of a semiconductor package (action 310). As shown in FIG. 4A, carrier 410 is represented as a pre-patterned conductive sheet or plate including conductive segments 410a and 410 having respective die surfaces 418a and 418b. As further shown in FIG. 4A, conductive segments 410a and 410b are separated by gap 409 in pre-patterned in carrier 410, which is shown to extend through the entire thickness carrier 410. It is noted that dashed lines 416 are shown to bridge gap 409 in FIG. 4A, as well as in FIG. 4B. Dashed lines 416 are present in those figures to indicate that gap 409 may be visible in FIGS. 4A and 4B due to the cross-sectional perspective viewed in those figures, but that gap 409 does not extend through carrier 410 in a direction perpendicular to the plane of the page of FIG. 4A and FIG. 4B.

Thus, carrier 410 may be provided by a single, substantially continuous, carrier support structure, fully patterned to provide gap 409. Conductive carrier 410 may be formed of any conductive material having a suitably low electrical resistance. Examples of materials from which carrier 410 may be formed include copper (Cu), aluminum (Al), or a conductive alloy. In one implementation, as noted above, carrier 410 may be implemented using a single semiconductor package lead frame.

Although the present exemplary implementation shows carrier 410 as including single gap 409, in other implementations, carrier 410 may have one or more gaps in addition to gap 409. Moreover, although not shown in the present figures, in some implementations, carrier 410 may include a barrier metal layer formed on die surfaces 418a and 418b, and/or the major surfaces of carrier 410 opposite die surfaces 418a and 418b. Such a barrier metal layer may be formed of nickel-gold (NiAu) or nickel-palladium-gold (NiPdAu), for example. In some implementations, such a barrier metal layer may serve as an etching mask during patterning of carrier 410. Thereafter, such a barrier metal layer can provide a solderable surface at die surfaces 418a and 418b, and/or the opposite major surfaces of carrier 410.

Figure 4B:
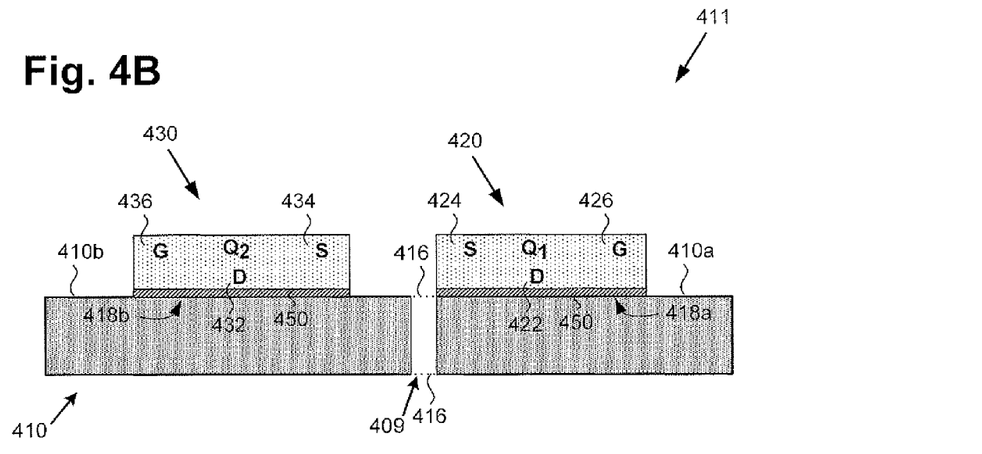
FIG. 4B illustrates a result of performing of a subsequent action according to the flowchart of FIG. 3 in accordance with one implementation of the present disclosure.

Moving to structure 411 in FIG. 4B with ongoing reference to FIG. 3, flowchart 300 continues with attachment of first and second transistors to respective die surfaces 418a and 418b of first and second conductive segments 410a and 410b (action 311). As shown in FIG. 4B, in one implementation, such first and second transistors may take the form, respectively, of control transistor 420 ($Q_1$) having drain 422, source 424, and gate 426, and sync transistor 430 ($Q_2$) having drain 432, source 434, and gate 436. As further shown in FIG. 4B, control transistor 420 is attached to die surface 418a of conductive segment 410a by electrically and thermally conductive die attach material 450, while sync transistor 430 is attached to die surface 418b of conductive segment 410b by electrically and thermally conductive die attach material 450.

Electrically conductive die attach material 450 may be any suitable substance, such as a conductive epoxy, solder, a conductive sintered material, or diffusion bonded material, for example, formed to a thickness of at least 10.0 μm. Control transistor 420 and sync transistor 430 are shown to have a vertical topology, wherein the sources and gates are situated on the same side of their respective transistor dies, while the drains 432 are situated on an opposite side of the respective transistor dies. Control transistor 420, sync transistor 430, and electrically and thermally conductive die attach material 450 correspond respectively to control transistor 220, sync transistor 230, and electrically and thermally conductive die attach material 250, in FIG. 2. It is noted that control transistor 420 and sync transistor 430 are disposed on carrier 410 such that their respective drains 422 and 432 are attached to respective die surfaces 418a and 418b.

Figure 4C:
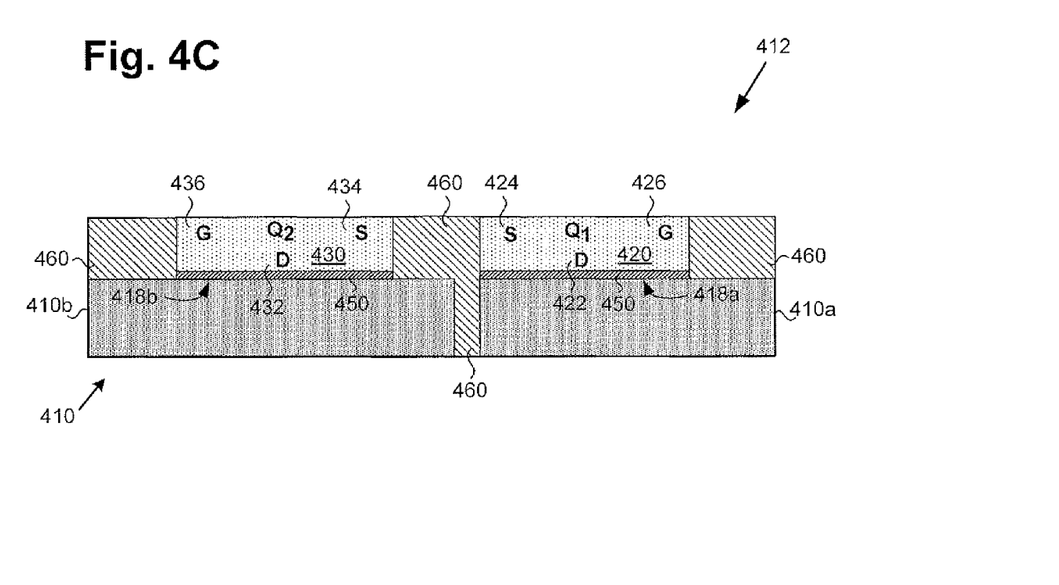
FIG. 4C illustrates a result of performing of a subsequent action according to the flowchart of FIG. 3 in accordance with one implementation of the present disclosure.

As shown by structure 412 in FIG. 4C, flowchart 300 continues with forming dielectric material 460 in exposed portions of carrier 410 (action 312). Dielectric material 460 may be any molding compound typically used in semiconductor packaging, for example. That is to say, dielectric material 460 may be an epoxy resin based molding compound, or any other material suitable for use as an encapsulant in semiconductor packaging. As further shown in FIG. 4C, dielectric material 460 covers portions of carrier 410 not covered by control transistor 420 or sync transistor 430, substantially fills gap 409, and adjoins control transistor 420 and sync transistor 430 while leaving sources 424 and 434, and gates 426 and 436 exposed. Dielectric material 460 corresponds to dielectric material 260, in FIG. 2.

Figure 4D:
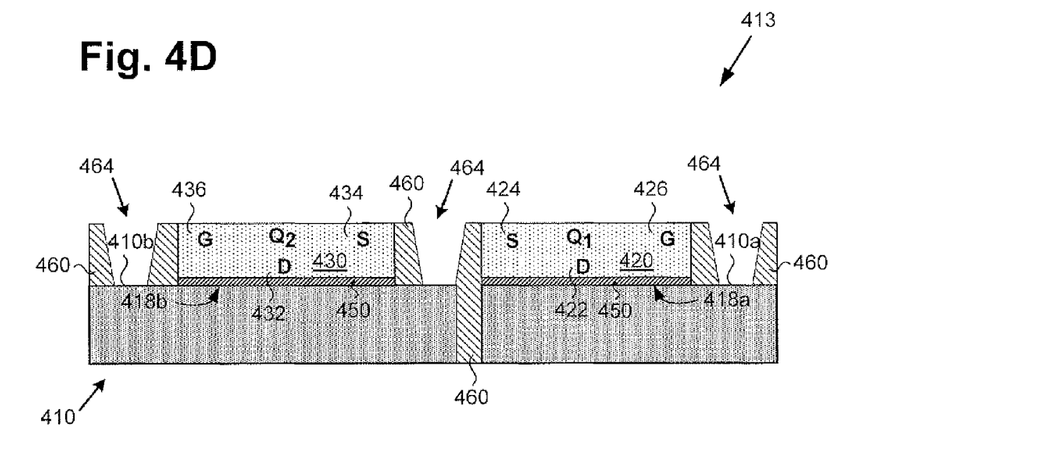
FIG. 4D illustrates a result of performing of a subsequent action according to the flowchart of FIG. 3 in accordance with one implementation of the present disclosure.
Figure 4E:
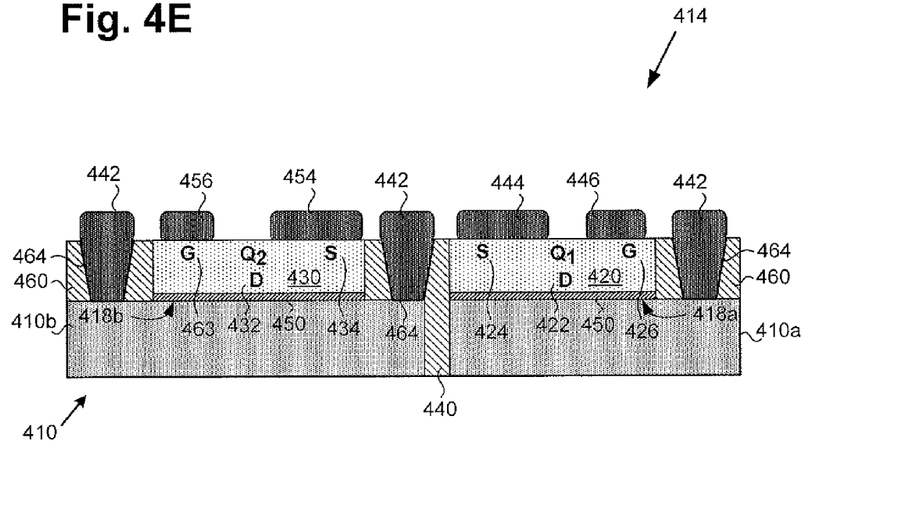
FIG. 4E illustrates a result of performing of a final action according to the flowchart of FIG. 3 in accordance with one implementation of the present disclosure.

Moving to structure 413 in FIG. 4D, flowchart 300 continues with forming vias 464 extending through dielectric material 460 to expose die surfaces 418a and 418b of respective conductive segments 410a and 410b (action 313). Vias 464 may be laser vias, for example, formed through ablation of dielectric material 460 using a laser drill. Continuing to structure 414 in FIG. 4E, flowchart 300 may conclude with filling of vias 464 with solder material 442 so as to cause solder material to protrude beyond dielectric material 460 (action 414). As shown in FIG. 4E, solder material 442 fills vias 464 so as to protrude beyond dielectric material 460 to electrically, thermally, and mechanically connect carrier 410 to a mounting surface corresponding to mounting surface 290, in FIG. 2. Also shown in FIG. 4E are solder bodies providing source contact 444 and gate contact 446 for control transistor 420, and source contact 454 and gate contact 456 for sync transistor 430.

It is noted that the solder bodies used to provide source contact 444 and gate contact 446 for control transistor 420, and source contact 454 and gate contact 456 for sync transistor 430 can be formed with the same solder material 442 used to fill vias 464. As a result, source contacts 444/454 and gate contacts 446/456 may advantageously be formed substantially concurrently with filling of vias 464 with solder material 442. In one implementation, solder material 442 may be dispensed to fill vias 464 and to form source contacts 444/454 and gate contacts 446/456 using a screen printing technique. Accordingly, solder or any other electrically conductive material may be used to fill vias 464 and to form source contacts 444/454 and gate contacts 446/456 based, for example, on its suitability for application in a screen printing or other substantially concurrent dispensation process.

Vias 464, source contacts 444/454, and gate contacts 446/456 correspond respectively to vias 264, source contacts 244/254, and gate contacts 246/256, in FIG. 2. It is noted that structure 414, in FIG. 4E, may be inverted and attached to a mounting surface, such as mounting surface 290, in FIG. 2, by solder material 442 to produce a semiconductor package corresponding to semiconductor package 208.

Figure 5:
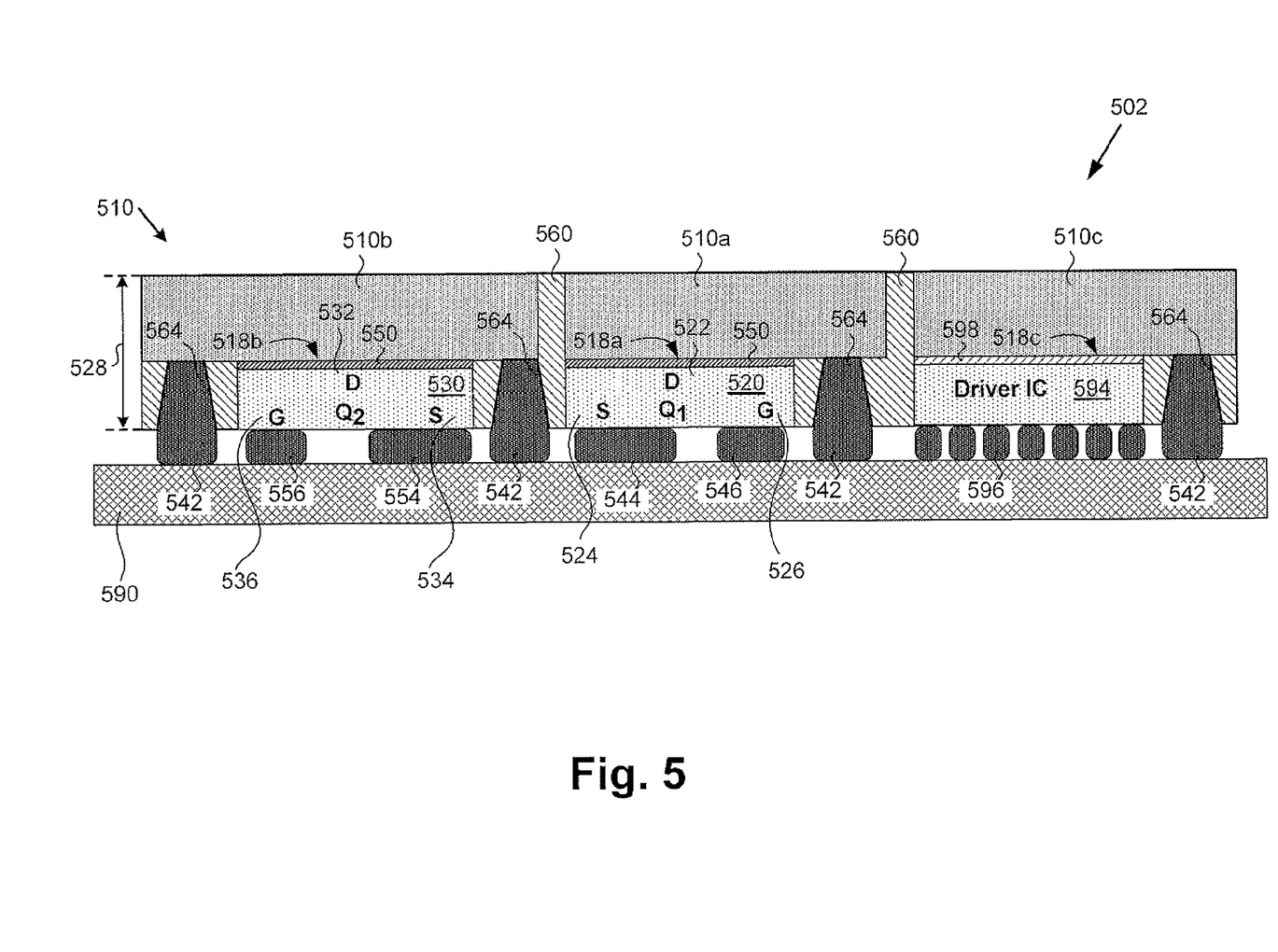
FIG. 5 shows an exemplary representation of a packaging solution according to another implementation of the present disclosure.

Although the implementations shown and described by reference to FIGS. 2, 3, and 4A-4E result in a power block MCM, such as semiconductor package 208, in FIG. 2, configured to enclose power block 108, in FIG. 1, in some applications, it may be desirable to produce a semiconductor package corresponding to power stage MCM 102. One exemplary implementation of such a power stage semiconductor package is shown by FIG. 5. One of ordinary skill in the art will readily understand that the exemplary method outlined by flowchart 300, in FIG. 3, can be suitably adapted to produce the exemplary power stage semiconductor package shown in FIG. 5.

FIG. 5 shows a cross-sectional view of power stage semiconductor package 502 attached to PCB or other mounting surface 590. Semiconductor package 502 has package height or thickness 528, and includes control transistor 520 (Q$_1$) having drain 522, source 524, and gate 526, as well as sync transistor 530 (Q$_2$) having drain 532, source 534, and gate 536. In addition, semiconductor package 502 includes driver IC 594 for driving one or both of control transistor 520 and the sync transistor 530.

As shown in FIG. 5, semiconductor package 502 also includes carrier 510 having conductive segment 510*a* with die surface 518*a*, conductive segment 510*b* with die surface 518*b*, and conductive segment 510*c* with die surface 518*c*. Semiconductor package 502 further includes vias 564 filled with solder material 542, electrically and thermally conductive die attach material 550, dielectric material 560, source contacts 544/554, and gate contacts 546/556. Also included as part of semiconductor package 502 are input/output (I/O) contacts 596 of driver IC 594 and die attach material 598 for attaching driver IC 594 to die surface 518*c* of conductive segment 510*c*.

Mounting surface 590, carrier 510, conductive segments 510*a* and 510*b*, control and sync transistors 520 and 530, and electrically and thermally conductive die attach material 550 correspond respectively to mounting surface 290, carrier 210, conductive segments 210*a* and 210*b*, control and sync transistors 220 and 230, and electrically and thermally conductive die attach material 250, in FIG. 2. In addition, package height or thickness 528, dielectric material 560, vias 564, solder material 542, source contacts 544/554, and gate contacts 546/556, in FIG. 5, correspond respectively to package height or thickness 228, dielectric material 260, vias 264, solder material 242, source contacts 244/254, and gate contacts 246/256, in FIG. 2. Moreover, it is noted that semiconductor package 502 including driver IC 594, in FIG. 5, corresponds in general to power stage MCM 102 including driver IC 194, in FIG. 1.

It is noted that the absence of I/O contacts at die surface 518*c* of conductive segment 510*c*, as well as the insulating properties of any encapsulant or packaging of driver IC 594 may be sufficient to isolate driver IC 594 from conductive segment 510*c* of carrier 510. As a result, in some implementations, die attach material 598 may be an electrically and thermally conductive die attach material similar to or substantially identical to electrically and thermally conductive die attach material 550. Alternatively, in some implementations, die attach material 598 may be a dielectric die attach material, thereby providing additional electrical isolation between carrier 510 and driver IC 594. It is further noted that, in some implementations, I/O contacts 596 may be formed substantially concurrently with filling of vias 564 and formation of source contacts 544/554 and gate contacts 546/556, such as through use of a screen printing technique, for example.

Thus, implementations of the present packaging solution utilize a carrier including conductive segments, and solder filled vias to provide a reliable, low resistance, and substantially parasitic free electrical switch node connection between a control and a sync transistor. The carrier also serves to conduct heat away from the enclosed power transistors, and thus may be configured as an integrated heat spreader of the semiconductor package. Moreover, use of the carrier and solder filled laser vias to provide heat removal and switch node connectivity enables a highly compact package design. For example, a package height, or thickness, resulting from the implementations disclosed in the present application may be less than approximately 0.4 mm, such as a package height or thickness of approximately 0.25 mm to approximately 0.3 mm.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:
   a carrier including first and second conductive segments;
   first and second transistors attached respectively to said first and second conductive segments;
   a dielectric material formed in exposed portions of said first and second conductive segments;
   a first via extending through said dielectric material to said first conductive segment, and a second via extending through said dielectric material to said second conductive segment;
   a solder material filling each of said first and second vias, said solder material protruding beyond said dielectric material and configured to electrically, thermally, and mechanically connect said carrier to a mounting surface for said semiconductor package.

2. The semiconductor package of claim 1, wherein said vias comprise laser vias.

3. The semiconductor package of claim 1, wherein said carrier is configured as an integrated heat spreader of said semiconductor package.

4. The semiconductor package of claim 1, wherein said first and second transistors comprise power transistors implemented in a power switching stage of a voltage converter.

5. The semiconductor package of claim 4, wherein said semiconductor package is configured to utilize said mounting surface to provide a switch node of said power switching stage.

6. The semiconductor package of claim 1, wherein said carrier comprises at least a portion of a lead frame.

7. The semiconductor package of claim 1, wherein said first and second transistors comprise vertical power field-effect transistors (FETs).

8. The semiconductor package of claim 1, wherein said first and second transistors comprise silicon FETs.

9. The semiconductor package of claim 1, wherein said first and second transistors comprise HI-Nitride high electron mobility transistors (HEMTs).

10. The semiconductor package of claim 1, further comprising a driver integrated circuit (IC) attached to a third conductive segment of said carrier, said driver IC configured to drive at least one of said first and second transistors.

11. A method for fabricating a semiconductor package, said method comprising:
attaching first and second transistors to respective first and second conductive segments of a carrier;
forming a dielectric material in exposed portions of said carrier;
forming a first via extending through said dielectric material to said first conductive segment, and a second via extending through said dielectric material to said second conductive segment;
filling said vias with a solder material, said solder material protruding beyond said dielectric material and configured to electrically, thermally, and mechanically connect said carrier to a mounting surface for said semiconductor package.

12. The method of claim 11, wherein forming said vias comprises utilizing a laser drill to form first and second laser vias.

13. The method of claim 11, wherein said carrier is configured as an integrated heat spreader of said semiconductor package.

14. The method of claim 11, wherein said first and second transistors comprise power transistors implemented in a power switching stage of a voltage converter.

15. The method of claim 14, wherein said semiconductor package is configured to utilize said mounting surface to provide a switch node of said power switching stage.

16. The method of claim 11, wherein said carrier comprises at least a portion of a lead frame.

17. The method of claim 11, wherein said first and second transistors comprise vertical power field-effect transistors (FETs).

18. The method of claim 11, wherein said first and second transistors comprise silicon FETs.

19. The method of claim 11, wherein said first and second transistors comprise III-Nitride high electron mobility transistors (HEMTs).

20. The method of claim 11, further comprising attaching a driver integrated circuit (IC) to a third conductive segment of said carrier, said driver IC being configured to drive at least one of said first and second transistors.

* * * * *

UNITED STATES PATENT AND TRADEMARK OFFICE
CERTIFICATE OF CORRECTION

PATENT NO. : 9,496,168 B2  Page 1 of 1
APPLICATION NO. : 14/605675
DATED : November 15, 2016
INVENTOR(S) : Eung San Cho It is certified that error appears in the above-identified patent and that said Letters Patent is hereby corrected as shown below:

In the Claims

Column 9, Claim 9, Line 13: Replace "comprise HI-Nitride high" with -- comprise III-Nitride high --

Signed and Sealed this
Sixth Day of June, 2017

Michelle K. Lee
*Director of the United States Patent and Trademark Office*